(12) United States Patent
Nakagawa

(10) Patent No.: US 11,012,064 B2
(45) Date of Patent: May 18, 2021

(54) SEMICONDUCTOR DEVICE

(71) Applicant: FUJI ELECTRIC CO., LTD., Kanagawa (JP)

(72) Inventor: Sho Nakagawa, Nagano (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 174 days.

(21) Appl. No.: 16/234,947

(22) Filed: Dec. 28, 2018

(65) Prior Publication Data
US 2019/0260370 A1 Aug. 22, 2019

(30) Foreign Application Priority Data

Feb. 16, 2018 (JP) .............................. JP2018-025817

(51) Int. Cl.
*H02H 3/00* (2006.01)
*H03K 17/082* (2006.01)

(52) U.S. Cl.
CPC ..... *H03K 17/0822* (2013.01); *H03K 17/0828* (2013.01)

(58) Field of Classification Search
CPC ................... H03K 17/0822; H03K 17/0828
USPC ......................................................... 361/87
See application file for complete search history.

(56) References Cited

U.S. PATENT DOCUMENTS

| | | | | |
|---|---|---|---|---|
| 5,621,601 A | * | 4/1997 | Fujihira | .............. H01L 27/0248 361/93.9 |
| 5,909,135 A | * | 6/1999 | Baldwin | ............ H03K 17/0822 327/328 |
| 6,218,889 B1 | * | 4/2001 | Fujiki | ..................... H01L 24/05 327/427 |
| 2009/0261861 A1 | | 10/2009 | Shimada | |

FOREIGN PATENT DOCUMENTS

| | | |
|---|---|---|
| JP | 2892686 B2 | 5/1999 |
| JP | 2007-121052 A | 5/2007 |
| JP | 2010-263032 A | 11/2010 |
| WO | WO 2012/137670 A1 | 10/2012 |

* cited by examiner

*Primary Examiner* — Jared Fureman
*Assistant Examiner* — Lucy M Thomas
(74) *Attorney, Agent, or Firm* — Paratus Law Group, PLLC

(57) ABSTRACT

A semiconductor device includes a main power semiconductor switching element, a current sense semiconductor switching element and a current sense semiconductor switching element protection circuit. The main power semiconductor switching element drives a load by switching. The current sense semiconductor switching element detects current flowing in the main power semiconductor switching element. The current sense semiconductor switching element protection circuit is provided between a gate of the main power semiconductor switching element and a gate of the current sense semiconductor switching element so as to protect the gate of the current sense semiconductor switching element at a reference potential different from that of the gate of the main power semiconductor switching element.

6 Claims, 4 Drawing Sheets

SEMICONDUCTOR DEVICE

CROSS-REFERENCE TO RELATED APPLICATIONS

The present application claims priority from Japanese Patent Application No. 2018-025817, filed Feb. 16, 2018, the entire content of which is incorporated herein by reference.

TECHNICAL FIELD

The present invention relates to a semiconductor device including a power semiconductor switching element and a current sense semiconductor switching element.

BACKGROUND ART

Some semiconductor devices which can be provided to electronic control systems for automobiles include not only a main MOSFET configured to perform a switching operation but also a sense MOSFET for sensing current (see JP-A-2010-263032 for instance). This type of semiconductor device is configured to detect current flowing in the main MOSFET, on the sense MOSFET side, by causing current flowing in the sense MOSFET to flow in a sense resistor and measuring the voltage between both ends of the sense resistor.

In this configuration, in order to improve the accuracy of current detection, the source of the main MOSFET and the source of the sense MOSFET may be virtually short-circuited by a differential amplifier, and this circuit configuration has been known (see WO 2012/137670 for instance).

In the above-mentioned circuit configuration, when the main MOSFET is turned on in response to a gate signal, current flows from the main MOSFET to a load resistor. Also, current according to the value of that current and a current sense ratio flows in the sense MOSFET. Specifically, in the main MOSFET, current (main current) having a value according to the number of cells of the main MOSFET flows, and in the sense MOSFET, current (sense current) having a value according to the number of cells of the sense MOSFET flows. The ratio of the number of cells of the main MOSFET and the number of cells of the sense MOSFET is referred to as a current sense ratio. That is, from the value of the sense current and the current sense ratio, it is possible to calculate the value of the main current. Therefore, the current flowing in the main MOSFET is detected by causing the current flowing in the main MOSFET through the sense resistor and measuring the voltage value between both ends of the sense resistor caused by the sense current.

In such a circuit configuration, in the case where a load to be driven is an inductive load, when the main MOSFET is turned off, a counter-electromotive force (a surge) of the inductive load is applied to the source of the main MOSFET. As a result, the source has a negative potential. This operation may break the main MOSFET 1n order to protect the main MOSFET, the potential of the gate of the main MOSFET is equalized to the potential of the source (the negative potential).

In this case, the gate of the sense MOSFET is connected directly to the gate of the main MOSFET, and the source of the sense MOSFET and the source of the main MOSFET are virtually short-circuited. Therefore, the potential of the gate of the sense MOSFET also becomes a negative potential. However, since the source of the sense MOSFET is also grounded via the sense resistor, if a steep surge is applied to the gate of the sense MOSFET, a gate insulating film of the sense MOSFET may be broken.

SUMMARY

An aspect of the present invention provides a semiconductor device which includes a current sense semiconductor switching element and can prevent the current sense semiconductor switching element from being broken by a counter-electromotive force of an inductive load to be driven.

According to an embodiment of the present invention, there is provided a semiconductor device including a main power semiconductor switching element, a current sense semiconductor switching element and a current sense semiconductor switching element protection circuit. The main power semiconductor switching element is configured to drive a load by switching. The current sense semiconductor switching element is configured to detect current flowing in the main power semiconductor switching element. The current sense semiconductor switching element protection circuit is provided between a gate of the main power semiconductor switching element and a gate of the current sense semiconductor switching element so as to protect the gate of the current sense semiconductor switching element at a reference potential different from that of the gate of the main power semiconductor switching element.

In this type of related-art semiconductor device, the gate of the main power semiconductor switching element and the gate of the current sense semiconductor switching element are directly connected such that a desired current sense ratio is obtained. In this case, for example, in the case where a load to be driven is an inductive load such as a motor, a steep negative surge voltage (a surge) is applied to the gate of the main power semiconductor switching element by a counter-electromotive force. In the related-art configuration, since the gate of the main power semiconductor switching element and the gate of the current sense semiconductor switching element are connected directly, and since the source of the main power semiconductor switching element and the source of the current sense semiconductor switching element are virtually short-circuited, the gate of the current sense semiconductor switching element also has a negative potential. Also, since the source of the current sense semiconductor switching element is grounded via a resistor for current detection and so on, if a current path to the ground is formed, a negative surge voltage is applied to the gate of the current sense semiconductor switching element. Therefore, the gate of the current sense semiconductor switching element may be broken.

However, in the above-described semiconductor device, the current sense semiconductor switching element protection circuit is configured to protect the gate of the current sense semiconductor switching element at a reference in potential different from that of the gate of the main power semiconductor switching element, i.e. at a different reference potential. Therefore, even if a steep surge occurs, the gate of the current sense semiconductor switching element can be protected from the steep surge by the current sense semiconductor switching element protection circuit.

Here, as a specific example of protection at different potentials, the gate of the main power semiconductor switching element is protected with reference to the source or gate of the main power semiconductor switching element from surges, and the gate of the current sense semiconductor switching element is protected with reference to the ground.

According to an embodiment of the present invention, a semiconductor device can be provided which includes a current sense semiconductor switching element and can prevent the current sense semiconductor switching element from being broken by an electromotive force of an inductive load to be driven.

DETAILED DESCRIPTION OF EMBODIMENTS

Hereinafter, a semiconductor device according to an embodiment of the present invention will be described in detail with reference to the drawings. One of features according to an embodiment of the present invention is to use a circuit configuration for preventing a negative surge voltage due to a counter-electromotive force of an inductive load from being applied to the gate of a current sense semiconductor switching element in the case of driving the inductive load. This will be described below in detail.

(Configuration)

Figure 1:
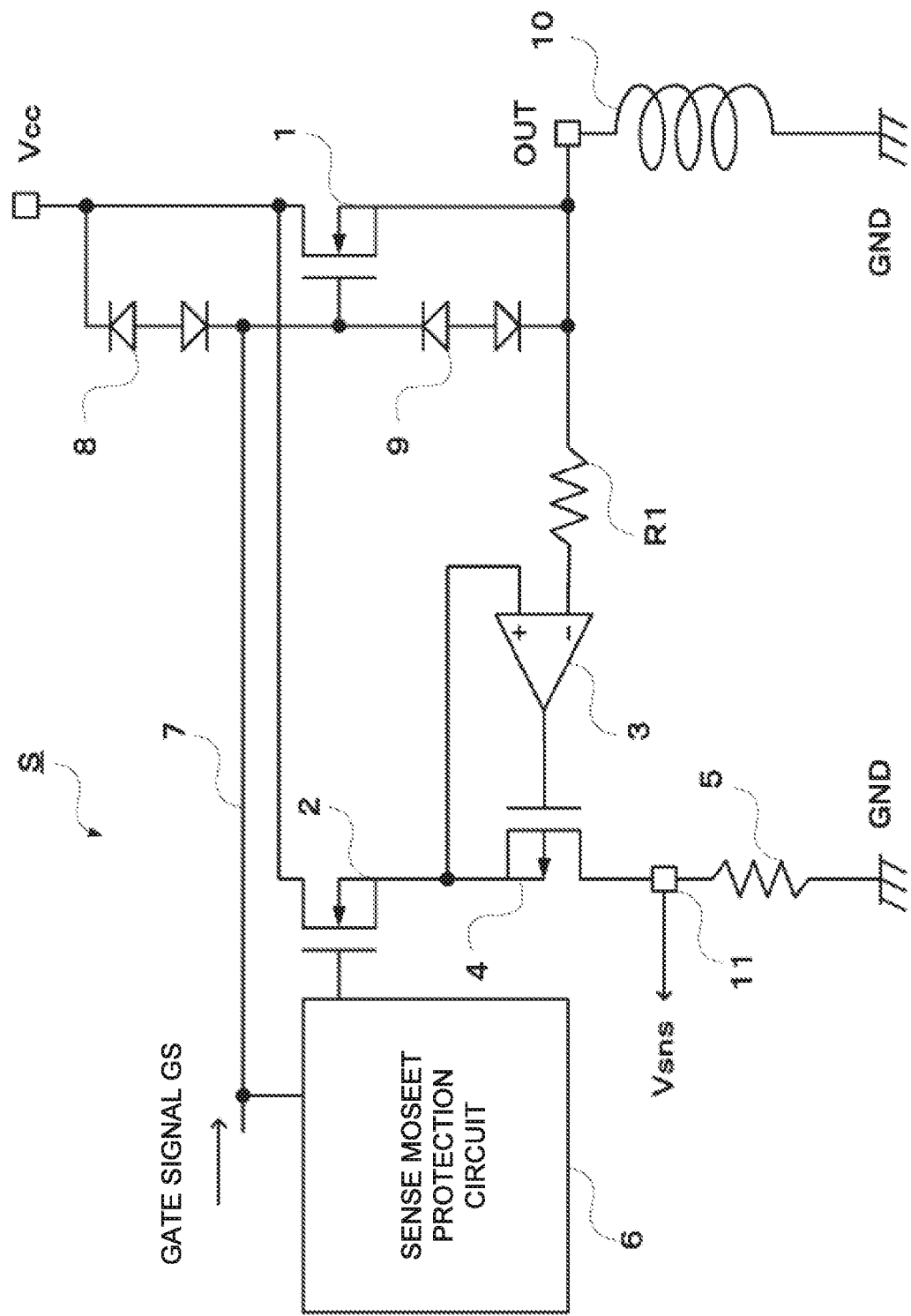
FIG. 1 is a circuit diagram illustrating a semiconductor device according to an embodiment of the present invention.

A semiconductor device according to the present embodiment can be provided to, for example, electronic control systems for automobiles. As shown in FIG. 1, a semiconductor device S mainly includes a main MOSFET 1, a sense MOSFET 2, a differential amplifier 3, a resistive element 4, a sense resistor 5, and a sense MOSFET protection circuit 6.

The main MOSFET 1 is, for example, an N-type power MOSFET serving as a high-side switch and is an example of a main power semiconductor switching element. This main MOSFET 1 has a drain which is connected to a power source Vcc and the drain of the sense MOSFET 2, a source which is connected to an inductive load 10, such as a solenoid of a parking brake, via an output terminal OUT, and a gate which is connected to a gate signal line 7 and is connected to the power source Vcc via a first bidirectional diode 8 and is connected to the source side of the main MOSFET 1 via a second bidirectional diode 9. The first bidirectional diode 8 is, for example, a dynamic clamp element for protecting the gate of the main MOSFET 1 in the case where a surge occurs on the power source Vcc side. The second bidirectional diode 9 is an element for protecting the gate of the main MOSFET 1 in the case where an electromotive force occurs in the inductive load 10. That is, the gate of the main MOSFET 1 is protected with reference to the drain or the source in terms of potential. In the present embodiment, a reference potential for protection from surges is referred to as a first reference potential.

The main MOSFET 1 performs switching according to a gate signal GS which is supplied to the gate via the gate signal line 7, so as to drive the inductive load 10 with the electric power of the power source Vcc which is a battery of an automobile, or the like.

The sense MOSFET 2 is an element for making it possible to detect current flowing between the drain and the source of the main MOSFET 1, on the sense MOSFET 2 side, and is an example of a current sense semiconductor switching element. This sense MOSFET 2 has a source which is connected to the source of the resistive element 4, and a gate which is connected to the gate signal line 7 via the sense MOSFET protection circuit 6. The sense MOSFET 2 has a structure similar to that of the main MOSFET 1. Specifically, the ratio of the number of cells of the main MOSFET 1 and the number of cells of the sense MOSFET 2 is appropriately set such that a desired current sense ratio is obtained.

Specifically, for example, in one semiconductor chip, the main MOSFET 1 and the sense MOSFET 2 are formed so as to have predetermined numbers of cells, respectively. In the main MOSFET 1, current having a value according to the number of cells of the main MOSFET flows, and similarly, in the sense MOSFET 2, current having a value according to the number of cells of the sense MOSFET flows. The ratio of the number of cells of the main MOSFET 1 and the number of cells of the sense MOSFET 2 is a current sense ratio. As an example, in the case where the ratio of the number of cells of the main MOSFET 1 and the number of cells of the sense MOSFET 2 is 1000:1, in the sense MOSFET 2, current which is as high as $\frac{1}{1000}$ of the current flowing in the main MOSFET 1 flows. Therefore, in the case of measuring the value of the current flowing in the sense MOSFET 2, it is possible to calculate the current flowing in the main MOSFET 1 based on the current sense ratio.

The differential amplifier 3 has a non-inverting input terminal which is connected to the source of the sense MOSFET 2, and an inverting input terminal which is connected to the source of the main MOSFET 1 via a resistor R1. The inverting input terminal is connected to one side of the second bidirectional diode 9 which is the opposite side of the second bidirectional diode to the side which is connected to the main MOSFET 1, via the resistor R1. In order to improve the accuracy of current detection, the source of the main MOSFET 1 and the source of the sense MOSFET 2 are virtually short-circuited by the non-inverting input terminal and the inverting input terminal of the differential amplifier 3. The differential amplifier 3 has an output terminal which is connected to the gate of the resistive element 4. Details of operations and so on of the differential amplifier 3 in this case are explained in detail, for example, in WO 2012/137670, and therefore, a detailed description thereof will not be made in this specification.

The resistive element 4 is, for example, a P-type MOSFET and has a drain which is connected to one end of the sense resistor 5 via a measurement node 11. The other end of the sense resistor 5 is connected to a ground GND. The sense resistor 5 generates a voltage Vsns according to the current which is supplied from the main MOSFET 1 to the inductive load 10, from the current flowing between the drain and the source of the sense MOSFET 2, with reference to the ground. By detecting the voltage Vsns on the measurement node 11, the value of the current flowing between the drain and the source of the sense MOSFET 2 is measured. The resistive element 4 is configured such that the resistance value of the resistive element 4 changes according to the output of the differential amplifier 3 having the non-inverting input terminal and the inverting input terminal virtually short-circuited which is supplied to the gate of the resistive element, so that the voltage between the drain and the source of the main MOSFET 1 and the voltage between the drain and the source of the sense MOSFET 2 are adjusted so as to become equal. As a result, the accuracy of current detection on the measurement node 11 can improve.

The sense MOSFET protection circuit 6 is a circuit for protecting the gate of the current sense semiconductor switching element, i.e. the sense MOSFET 2 of the present embodiment in the case where a counter-electromotive force occurs in the inductive load 10, and is an example of a current sense semiconductor switching element protection circuit. An example of the configuration of the sense MOSFET protection circuit 6 is shown in FIG. 2.

Figure 2:
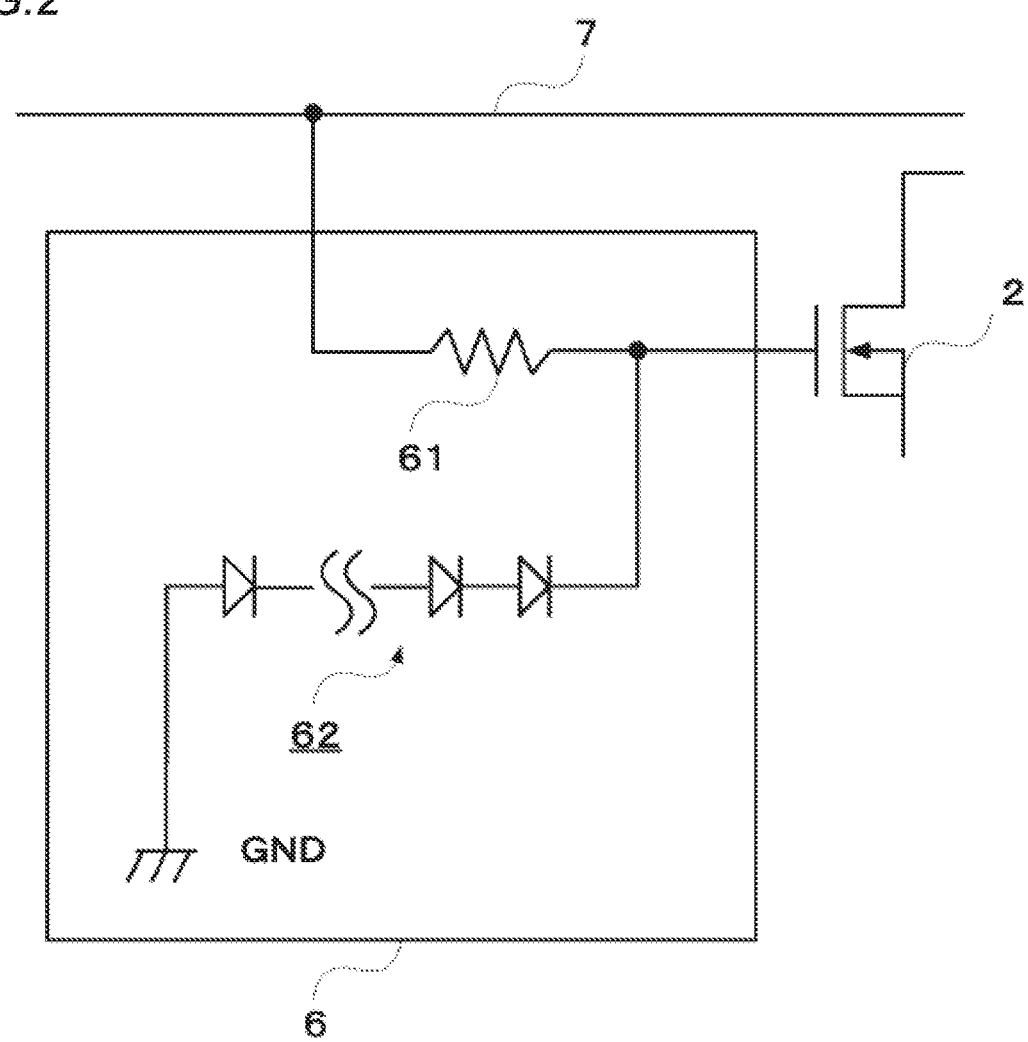
FIG. 2 is a circuit diagram illustrating a sense MOSFET protection circuit shown in FIG. 1.

As shown in FIG. 2, the sense MOSFET protection circuit 6 includes a separation resistor 61 and a plurality of diodes 62. The separation resistor 61 and the plurality of diodes 62 separate the gate of the sense MOSFET 2 from the gate of the main MOSFET 1 (which is protected with reference to the source or the drain of the main MOSFET) in terms of potential, so as to protect the gate of the sense MOSFET with reference to the ground GND. In the present embodiment, this reference potential for protection is referred to as a second reference potential. That is, the sense MOSFET protection circuit 6 of the present embodiment protects the gate of the sense MOSFET 2 at the second reference potential different from the above-mentioned first reference potential. Details thereof will be described in the following description of operations and effects.

The separation resistor 61 is disposed between the gate of the sense MOSFET 2 and the gate signal line 7. That is, in the present embodiment, the gate of the main MOSFET 1 and the gate of the sense MOSFET 2 are not directly connected and are separated by the separation resistor 61. Details of operations based on this configuration will be described below.

The plurality of diodes 62 include n-number of diodes which can obtain a designed current sense ratio without clamping the voltage by the reverse breakdown voltage of the diodes in the sense MOSFET protection circuit 6, with respect to the gate of the main MOSFET 1 and the gate of the sense MOSFET 2. In other words, the plurality of diodes includes n-number of diodes which allow current having a value according to the current sense ratio to flow in the sense MOSFET 2 as designed. The plurality of diodes 62 are connected in series in the forward direction from the ground GND toward the gate of the sense MOSFET 2, and the cathode of a diode on one end side is connected to the gate of the sense MOSFET 2 and the separation resistor 61, and the anode of a diode on the other end side is connected to the ground GND. In the case where the gate of the sense MOSFET 2 has a negative potential due to a surge, the plurality of diodes 62 protect the gate of the sense MOSFET 2 separated from the gate of the main MOSFET 1 by the separation resistor 61, with reference to the ground. The number "n" will be described in detail in the following description of operations and effects.

(Operations and Effects)

Figure 3:
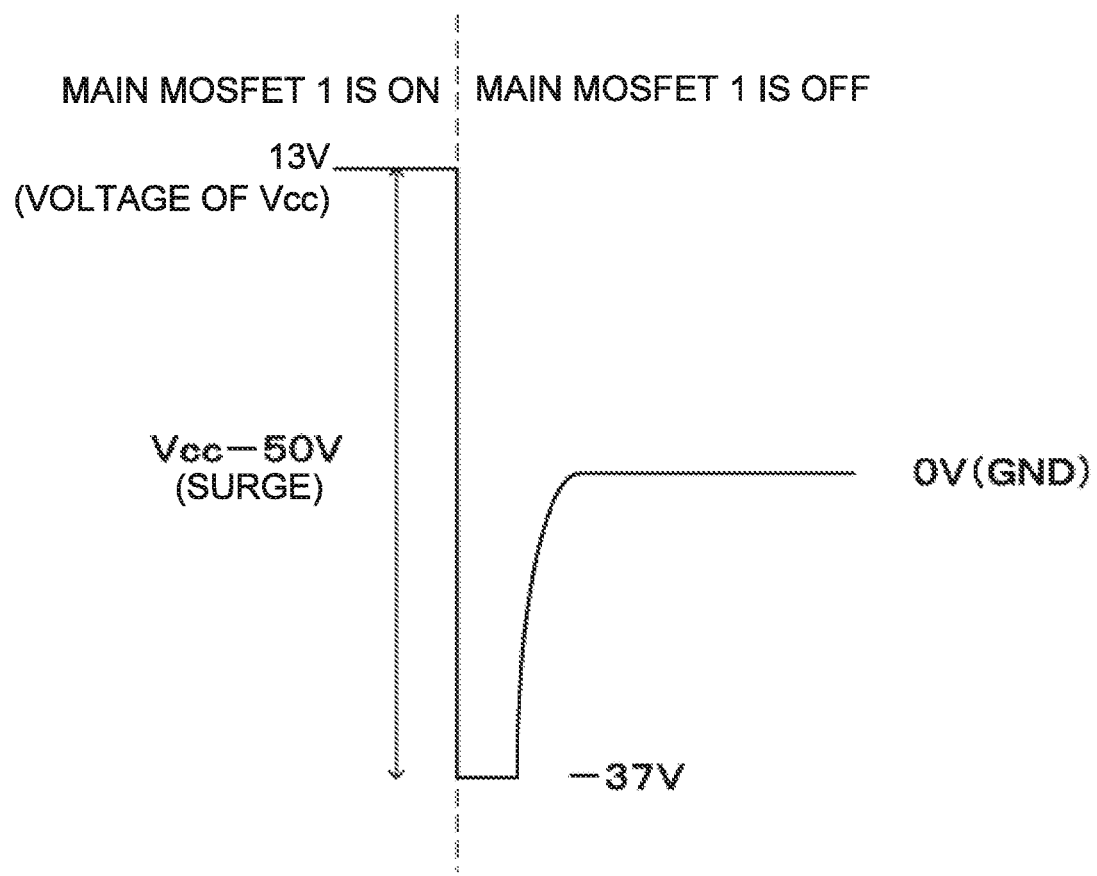
FIG. 3 is a view for explaining operations of the semiconductor device of FIG. 1.

Operations and effects of the semiconductor device S according to the present embodiment will be described. When the main MOSFET 1 is turned off according to the gate signal GS supplied via the gate signal line 7, a counter-electromotive force occurs due to the inductive load 10 connected to the output terminal OUT, as shown in FIG. 3. This counter-electromotive force causes the gate of the main MOSFET 1 to have a negative potential via the source of the main MOSFET 1.

For example, in the case where the voltage of the power source Vcc is approximately 13 V, and the ground is potentially 0 V, the negative potential which is caused by the counter-electromotive force is approximately −37 V. In other words, in this example, a steep surge of Vcc−50 V (13 V+37 V) occurs.

Figure 4:
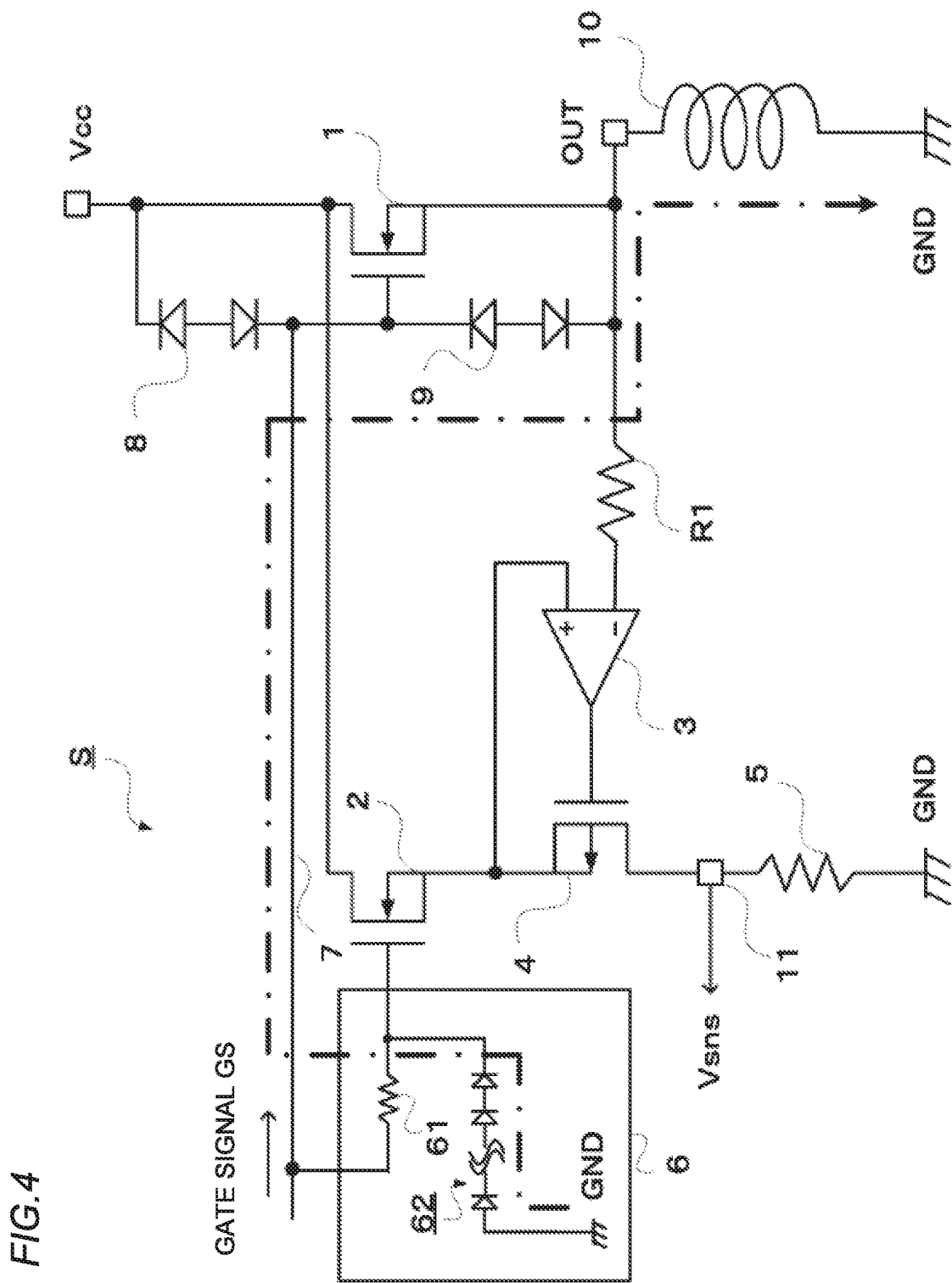
FIG. 4 is a circuit diagram for explaining the operations of the semiconductor device of FIG. 1.

Here, the gate of the main MOSFET 1 is protected from this surge by the second bidirectional diode 9. The gate of the sense MOSFET 2 is protected by the sense MOSFET protection circuit 6. Specifically, first, the gate of the sense MOSFET 2 is potentially separated from the gate of the main MOSFET 1 by the separation resistor 61 and the plurality of diodes 62. Therefore, if the above-mentioned surge occurs and the surge voltage is applied to the main MOSFET 1 and the sense MOSFET 2, the gate of the main MOSFET 1 has a negative potential, and similarly, the gate of the sense MOSFET 2 also has a negative potential. However, the gate of the sense MOSFET 2 is separated by the separation resistor 61 and is protected with reference to the ground GND by the plurality of diodes 62. Therefore, even if the surge is Vcc−50 V as described above, as shown by an alternate long and short dash line in FIG. 4, the gate of the sense MOSFET 2 does not have a negative potential below −Vf×n (V), and current flows from the ground GND having higher potential to the sense MOSFET 2 having lower potential. Therefore, the gate insulating film of the sense MOSFET 2 is protected from the surge. Here, Vf is the forward voltage of each diode, and n is the number of diodes 62. In this way, a steep negative voltage which may cause a breakdown of the gate insulating film can be prevented from being applied to the gate of the sense MOSFET 2, and a breakdown of the elements of the sense MOSFET 2 can be prevented from occurring.

The number of diodes 62, i.e. n will be described in more detail. The number of diodes 62, i.e. n is selected (set) based on the resistance value of the separation resistor 61 and the numbers of cells of the main MOSFET 1 and the sense MOSFET 2 so as not to cause a difference in gate voltage between the gate of the main MOSFET 1 and the gate of the sense MOSFET 2 in the case where the main MOSFET 1 is turned on. As a result, a designed current sense ratio is maintained. In other words, in order to obtain a desired current sense ratio, the number of diodes 62, i.e. n can be appropriately selected within a range in which a difference in gate voltage is not caused between the gate of the main MOSFET 1 and the gate of the sense MOSFET 2.

For example, n can be selected such that in the case where Vcc+10 V (an output voltage from a charge pump or the like (not shown)) is applied, as the gate signal GS of turning on, to the gate of the main MOSFET 1 and the gate of the sense MOSFET 2, the forward drop voltage (Vf×n [V]) of the plurality of diodes 62 connected in series becomes higher than the voltage of the gate signal GS of turning on the sense MOSFET 2, i.e. Vcc+10 V, such that the plurality of diodes 62 does not clamp the gate signal GS for the sense MOSFET 2. According to this configuration, a desired current sense ratio can be maintained. For example, in the case where the voltage which may be clamped by each diode is 10 V, it is preferable to set the number of stages of diodes 62 to four. Also, since the main MOSFET 1 of the present embodiment is a high-side switch, in order to completely turn on the main MOSFET, the output of the charge pump or the like needs to be a voltage higher than that of the drain side.

According to the above-described embodiment, the gate of the sense MOSFET 2 is separated from the gate of the main MOSFET 1 by the separation resistor 61. Also, in order to protect the gate of the sense MOSFET 2 with reference to the ground in terms of potential, the gate of the sense MOSFET 2 is connected to the ground via the plurality of diodes 62 connected in the reverse direction. If such a configuration is used, the gate of the sense MOSFET 2 is separated from the gate of the main MOSFET 1 in terms of potential, so that it becomes possible to protect the gate of the sense MOSFET 2 from a surge which is caused by a counter-electromotive force of the inductive load 10 in the case where the main MOSFET 1 is turned off.

Also, the plurality of diodes 62 include n-number of diodes which are selected so as not to cause a difference in gate voltage between the gate of the main MOSFET 1 and the gate of the sense MOSFET 2. According to this configuration, it is possible to maintain the designed current sense ratio. In other words, although the sense MOSFET protection circuit 6 is used, it is possible to flow current having a value according to a current sense ratio in the sense MOSFET 2 as designed. Therefore, it is possible to keep the advantage that the source of the main MOSFET 1 and the source of the sense MOSFET 2 are virtually short-circuited, so the accuracy of current detection can improve. Also, it is possible to obtain an advantage of reducing loss as compared to current detection using shunt resistors, which is an original advantage of the circuit configuration using the sense MOSFET 2.

Although the embodiment of the present invention has been described above, the present invention is not limited to the above-described embodiment, and a variety of applications and modifications can be made without departing from the technical scope of the present invention.

For example, in the above-described embodiment, the case where the power semiconductor switching element for driving the inductive load 10 is the main MOSFET 1, and accordingly, the current sense semiconductor switching element is the sense MOSFET 2 has been described as an example. However, the present invention is not limited to this case. The present invention can also be applied to other types of power semiconductor switching elements if appropriate applications, changes, and so on are added such that the gate of a main power semiconductor switching element and the gate of a current sense semiconductor switching element are protected at different potential references from surges. For example, as the type of the main power semiconductor switching element and the current sense semiconductor switching element, in place of the MOSFET type, an IGBT type may be used, and in this case, the number of diodes of the current sense semiconductor switching element protection circuit and so on may be appropriately changed such that a desired sense ratio is obtained.

The invention claimed is:

1. A semiconductor device comprising:
a main power semiconductor switching element configured to drive a load by switching;
a current sense semiconductor switching element configured to detect current flowing in the main power semiconductor switching element; and
a current sense semiconductor switching element protection circuit provided between a gate of the main power semiconductor switching element and a gate of the current sense semiconductor switching element so as to protect the gate of the current sense semiconductor switching element at a reference potential different from that of the gate of the main power semiconductor switching element,
wherein the gate of the main power semiconductor switching element uses a potential of either one of a source and a drain of the main power semiconductor switching element as a first reference potential,
wherein the current sense semiconductor switching element protection circuit is configured to protect the gate of the current sense semiconductor switching element using a ground potential as a second reference potential, and
wherein the current sense semiconductor switching element protection circuit further includes:
a resistor connected between the gate of the main power semiconductor switching element and the gate of the current sense semiconductor switching element; and
a plurality of diodes connected in series in a forward direction from a ground toward the gate of the current sense semiconductor switching element, wherein a cathode of a diode of the plurality of diodes on one end side of the plurality of diodes is directly connected to the gate of the current sense semiconductor switching element and the resistor, and an anode of a diode of the plurality of diodes on the other another end side of the plurality of diodes is directly connected to the ground.

2. The semiconductor device according to claim 1, wherein a number of the plurality of diodes is set so as to allow current having a value according to a designed current sense ratio which is a ratio of a number of cells of the main power semiconductor switching element and a number of cells of the current sense semiconductor switching element to flow in the current sense semiconductor switching element.

3. The semiconductor device according to claim 1, wherein a number of the plurality of diodes is set such that a forward drop voltage of the plurality of diodes connected in series is higher than a voltage of a gate signal of turning on the current sense semiconductor switching element so as not to clamp the gate signal for the current sense semiconductor switching element.

4. The semiconductor device according to claim 1, wherein when the main power semiconductor switching element is turned off, the gate of the main power semiconductor switching element is configured to have a negative potential and the gate of the current sense semiconductor switching element is configured to have a negative potential.

5. The semiconductor device according to claim 1, wherein the load is electrically connected between a low potential side terminal of the main power semiconductor switching element and a ground potential.

6. The semiconductor device according to claim 1, wherein a sense resistor is electrically connected between a low potential side terminal of the current sense semiconductor switching element and a ground potential.

* * * * *